United States Patent
Gau

Patent Number: 6,057,196
Date of Patent: May 2, 2000

[54] SELF-ALIGNED CONTACT PROCESS COMPRISING A TWO-LAYER SPACER WHEREIN ONE LAYER IS AT A LEVEL LOWER THAN THE TOP SURFACE OF THE GATE STRUCTURE

[75] Inventor: Jing-Horng Gau, Hsinchu Hsien, Taiwan

[73] Assignee: United Semiconductor Corp., Hsinchu, Taiwan

[21] Appl. No.: 09/241,793

[22] Filed: Feb. 1, 1999

[30] Foreign Application Priority Data

Dec. 23, 1998 [TW] Taiwan ................... 87121503

[51] Int. Cl.⁷ ............. H01L 21/336; H01L 21/3205
[52] U.S. Cl. ............. 438/279; 438/303; 438/586; 438/595; 438/948
[58] Field of Search ............. 438/303, 279, 438/586, 595, 948

[56] References Cited

U.S. PATENT DOCUMENTS

| | | |
|---|---|---|
| 5,061,647 | 10/1991 | Roth et al. . |
| 5,268,330 | 12/1993 | Givens et al. . |
| 5,466,637 | 11/1995 | Kim . |
| 5,714,413 | 2/1998 | Brigham et al. . |
| 5,736,442 | 4/1998 | Mori . |
| 5,807,779 | 9/1998 | Liaw . |

*Primary Examiner*—John F. Niebling
*Assistant Examiner*—Ron Pompey
*Attorney, Agent, or Firm*—Jiawei Huang; J.C. Patents

[57] ABSTRACT

A self-aligned contact process for fabricating semiconductor devices on a semiconductor substrate is described. The present process comprises providing two gates structure on a semiconductor substrate, wherein the gate structure comprises a gate and a passivation layer on the top surface thereof. A buffer layer is conformally overlaid on the gate structure, passivation layer and the semiconductor substrate. A photoresist material is formed on the semiconductor substrate to a level between the top surface of the passivation layer and interface between the passivation layer and gate. The buffer layer is removed to the level of the photoresist layer. Next, the photoresist material is removed. A spacer is formed on the sidewall of the buffer layer and the passivation layer of the gate structure. An insulating layer is formed on the semiconductor substrate and then, a contact opening is formed therein to expose the semiconductor substrate.

15 Claims, 3 Drawing Sheets

SELF-ALIGNED CONTACT PROCESS COMPRISING A TWO-LAYER SPACER WHEREIN ONE LAYER IS AT A LEVEL LOWER THAN THE TOP SURFACE OF THE GATE STRUCTURE

CROSS-REFERENCE TO RELATED APPLICATION

This application claims the priority benefit of Taiwan application Ser. No. 87121503, filed Dec. 23, 1998, the full disclosure of which is incorporated herein by reference.

BACKGROUND OF THE INVENTION

1. Field of the Invention

The invention relates to process for fabricating semiconductor devices, and more particularly to a self-aligned contact process for fabricating semiconductor devices.

2. Description of the Related Art

The semiconductor industry is continually striving to improve the performance of semiconductor devices, while still attempting to reduce the size thereof for faster but lower cost devices. For enhancing the integration on the semiconductor, for example, in the structure of a Dynamic Random Access Memory (DRAM), reductions are proposed in the source/drain contact areas on metal oxide semiconductor (MOS). Therefore, while the areas for source/drain are reduced, the formation of contact openings on the source/drain in MOS for filling conductive material and the alignment thereof are an important task.

A self-aligned contact process is developed for resolving the above problems, which allows smaller devices to be constructed. FIGS. 1A to 1C schematically illustrate the cross-sectional representations of a conventional self-aligned contact process.

With reference to FIG. 1A, a gate oxide 105 and gate 110 are provided on a semiconductor substrate. Gate 110 is composed of a doped polysilicon layer 120 and tungsten silicide 130. Silicon nitride 140 is used as a passivation layer for gate 110.

Turning to FIG. 1B, a conformal buffer layer 150 is formed on the gate oxide 105, gate 110 and silicon nitride 140. A spacer 160 is formed on the sidewall 155 of the buffer layer 150. The material of the buffer layer 150 is silicon oxide, while the material of the spacer is silicon nitride.

Referring to FIG. 1C, an insulating layer 170 is formed by chemical vapor deposition (CVD) and then is etched by photolithography. The material of an insulating layer 170 is silicon oxide. In this process, since the top surface and the side wall of gate 110 is protected by silicon nitride 140 and spacer 160, a selective etching of silicon oxide 170 is performed to expose the substrate between the spacers 160 as a contact opening 180. However, since both of the material of the buffer layer 150 and insulating layer 170 are silicon oxide, when selectively etching the insulating layer 170, the buffer layer 150 is etched at the same time to result in a defect 190. Furthermore, in the subsequent procedure, before the conductive material fills the contact opening 180, the semiconductor substrate is stripped with RCA solution ($H_2O_2/NH_4OH/H_2O$ solution) which can etch away the silicon oxide. During the step of stripping the substrate with RCA solution, the defect 190 is etched more to expose the tungsten silicide 130, and even to expose the doped polysilicon layer 120. When filling the contact opening 180 with conductive material for forming conductive line, the defect 190 is filled at same time. A short occurs between gate 110 and conductive line.

One approach for resolving the above-mentioned problems is to employ a thinner buffer layer 150 to reduce the possibility of etching the buffer layer 150. Typically, the thickness of the buffer layer 150 should be at least 200Å. In this approach, a thickness of 100–200Å for the buffer layer 150 is suggested . However, one purpose of the buffer layer 150 is to decrease the stress of the space 160 in the thermal treatment in the following procedures. Therefore, the thinner buffer layer will result in the dislocation of the substrate.

Another approach for resolving the above-mentioned problems is the formation of a buffer layer by thermal oxidation process, rather than by chemical vapor deposition as used in the conventional process. In the thermal oxidation process, the sidewall of the doped polysilicon layer and tungsten silicide layer of gate is formed on a passivation layer, while no oxide is formed on the top surface of the gate, which is silicon nitride. In such a case, the buffer layer on the sidewall of the gate is embedded in the spacer. Therefore, no defect in the buffer layer is formed during the etching process. However, an additional oxidation process is incorporated and thermal treatment results in adversely affecting the substrate, such as causing a dislocation of the substrate.

Therefore, a need exists to avoid the occurrence of short between a conductive line and a gate in the self-aligned contact process.

SUMMARY OF THE INVENTION

It is therefore an object of the present invention to provide a self-aligned contact process to avoid the occurrence of a short between conductive material in the contact openings and a gate on a semiconductor substrate.

The present invention is to provide a self-aligned contact process for formation of a contact opening on semiconductor substrate, comprising providing at least two gate structure on a semiconductor substrate, wherein each gate structure comprises a gate and a passivation layer on the top surface thereof. A buffer layer is formed to cover the sidewall of the gate. Then, a spacer is formed on the sidewall of the buffer layer and the passivation layer of the gate structure. An insulating layer is formed on the semiconductor substrate and etched to form a contact opening therein to expose the semiconductor substrate.

In accordance with the present invention, the formation of a buffer layer to cover the sidewall of the gate comprises forming photoresist material on the surface of the semiconductor substrate and then etching back the layer of photoresist material to a level lower than the top surface of the passivation layer. Next, the buffer layer is removed to the level of the layer of photoresist material and then, the etched photoresist layer is removed.

It is to be understood that both the foregoing general description and the following detailed description are exemplary and explanatory only and are not restrictive of the invention, as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

The process described below does not form a complete process flow for a self-aligned contact process in fabrication of integrated circuits. The present invention can be practiced in conjunction with integrated circuit fabrication techniques currently used in the art and only as much of the commonly practiced process steps are included as is necessary for an understanding of the present invention.

Figure 1A:
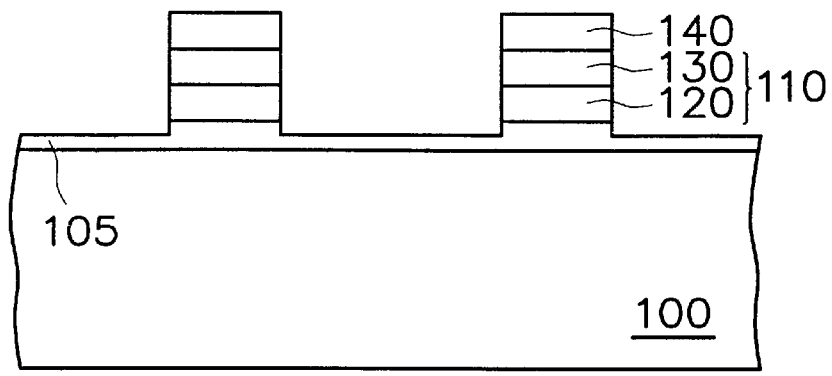
FIGS. 1A to 1C are schematic, cross-sectional views illustrating the steps of a conventional self-aligned contact process.
Figure 1B:
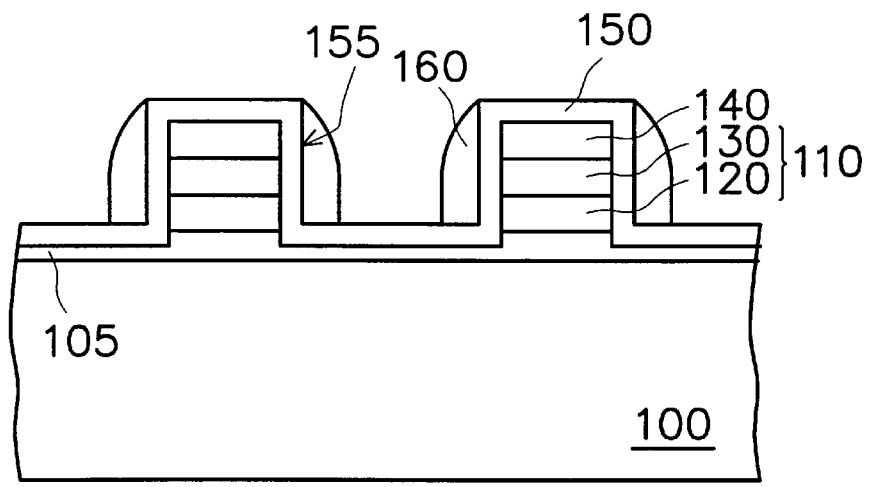
Figure 1C:
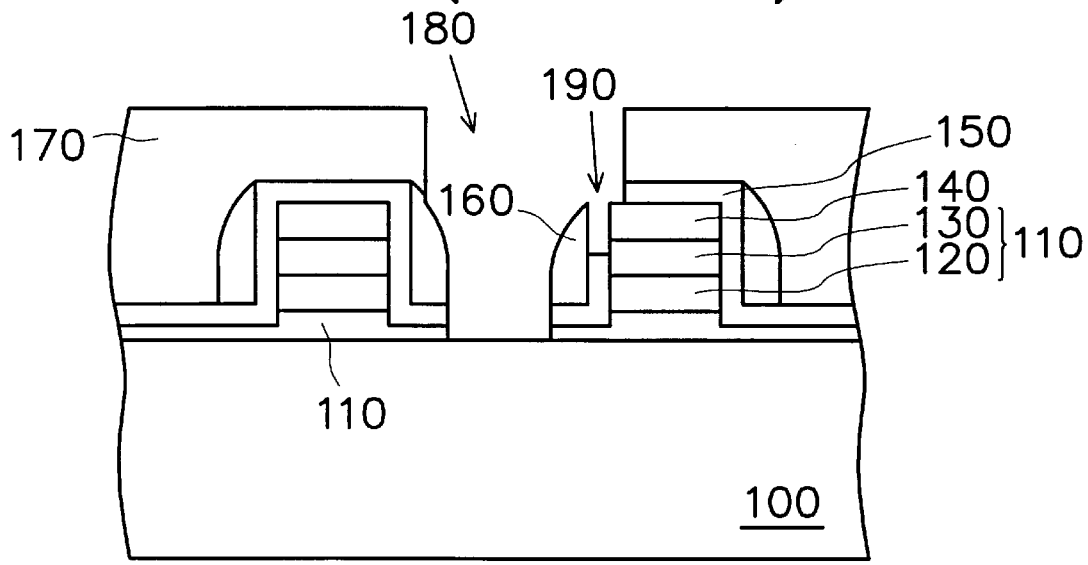
Figure 2A:
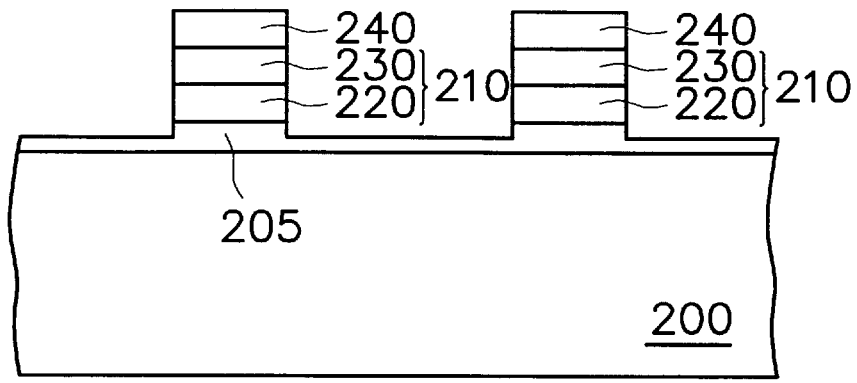
FIGS. 2A to 2E are schematic, cross-sectional views illustrating one preferred embodiment of the self-aligned contact process in accordance with the present invention.

With reference to FIG. 2A, a gate oxide layer 205 is provided on a semiconductor substrate 200, which is formed, for example, by thermal oxidation. At least two gate structures are formed on the gate oxide layer 205, which comprises at least one doped polysilicon layer 220 and silicide layer 230, wherein the suitable material used as silicide 230 is tungsten silicide or titanium silicide. A passivation layer 240 is overlaid on the top surface of gate structure 210, the material of which is, for example, silicon nitride.

Figure 2B:
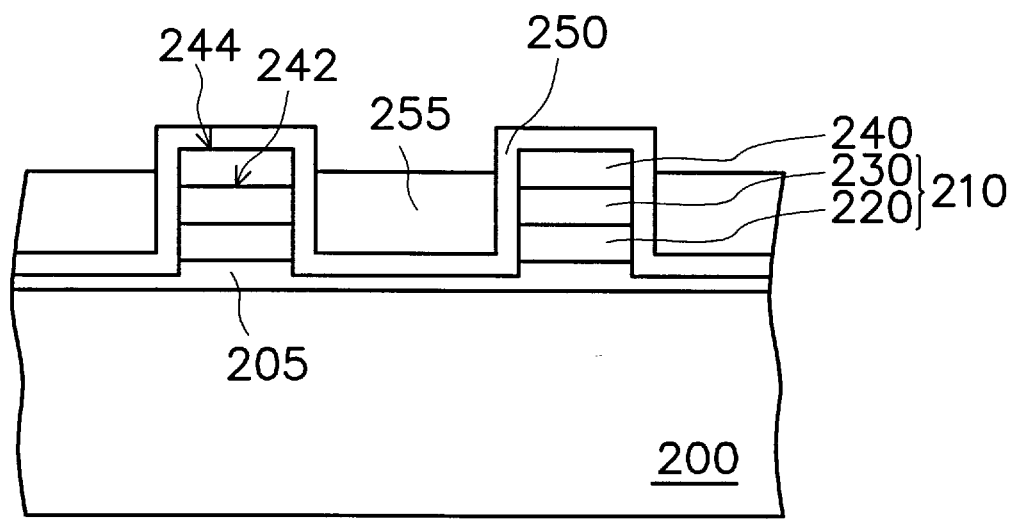

Turning to FIG. 2B, a conformal buffer layer is formed on the surface of passivation layer 240, gate structure 210 and semiconductor substrate 200. A suitable material for buffer layer 250 is, for example, silicon nitride, which is applied by chemcial vapor deposition process. The thickness of the buffer layer 250 is preferably about 200 to 300Å. Next, a photoresist layer 255 is formed on the semiconductor substrate 200 at a level lower than the top surface of passivation layer 240 but higher than the interface of gate structure 210 and passivation layer 240. The procedures for formation of the photoresist layer 255 comprise forming a layer of photoresist over the surface of the semiconductor substrate 200, and etching back the photoresist layer to the level lower than the top surface of passivation layer 240 but higher that the interface of gate structure 210 and passivation layer 240 by, for example, an oxygen plasma process.

Figure 2C:
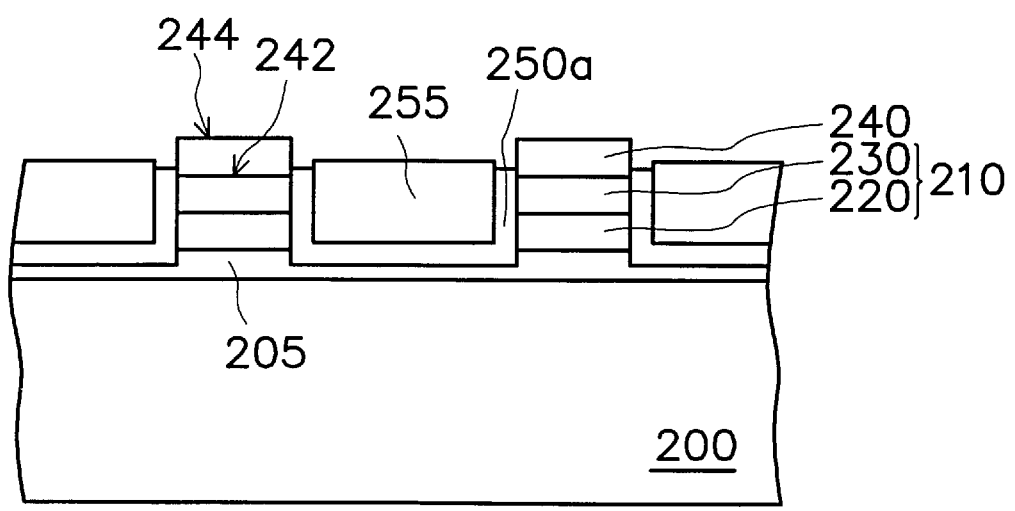

A portion of the buffer layer 250, which is not covered with the photoresist layer 255, is removed, as shown in FIG. 2C. After removing the portion of the buffer layer 250 which is not covered with photoresist layer 255, the remaining buffer layer 250a still protects the gate structure 210. A suitable procedure employed to remove the exposed buffer layer 255 in performance of the present invention is preferably a wet etching process.

Figure 2D:
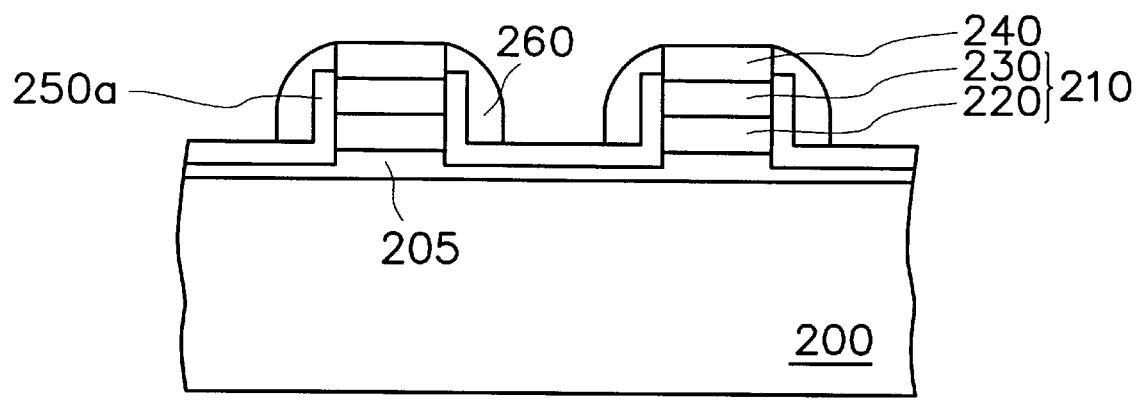

Next, the photoresist layer 255 is removed. A spacer 260 is formed on the sidewall of gate structure and the passivation layer 240, wherein the buffer layer 250a is embedded in the spacer 260, as shown in FIG. 2D. Therefore, the gate structure is covered with passivation layer 240 and spacer 260. A suitable material for spacer 260 is preferably silicon nitride.

Figure 2E:
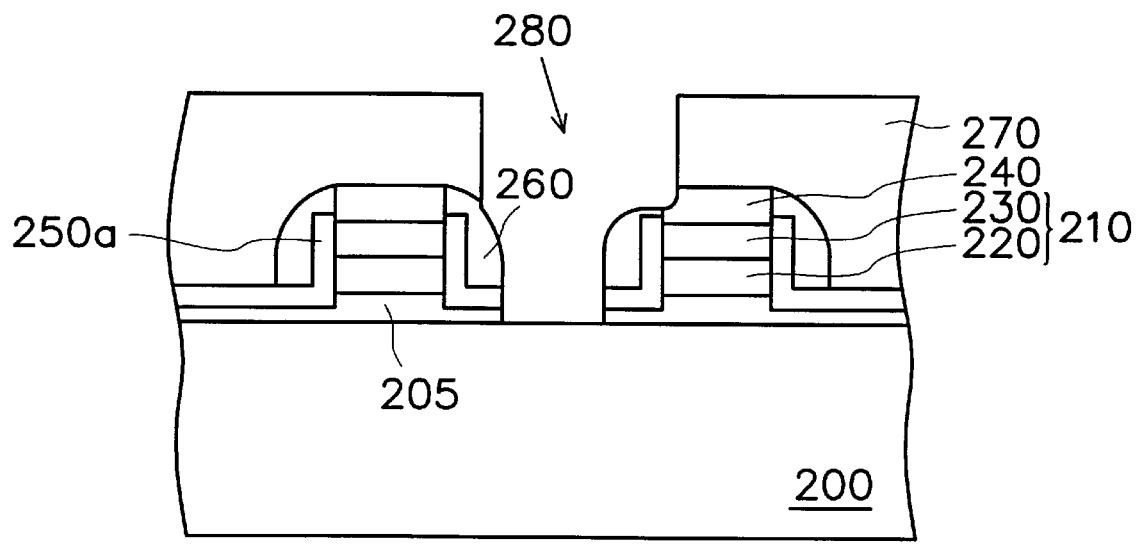

Referring to FIG. 2E, an insulating layer 270 is formed to cover the surface of the semiconductor substrate 200. The insulating layer 270 is defined to form a contact opening which exposes the semiconductor substrate 200 between the spacers 260. A suitable material for insulating layer 270 is preferably silicon nitride. The process used for forming contact opening 280 is, for example, anisotropic etching. In this preferred embodiment of the present invention, the etching rate of the insulating layer 270, passivation layer 240 and spacer 260 are different from one another in order to perform a selective etching process. Therefore, only insulating layer 270 is etched. In the case that material of the insulating layer 270 is silicon nitride and those of the passivation layer 240 and spacer layer 260 are silicon nitride, the etching process of insulating layer 270 can be performed, for example, by $CHF_3/CF_4$ plasma treatment.

In accordance with this preferred embodiment of the present invention, the buffer layer 250a is embedded in the spacer 260, and no buffer layer is etched while the etching process of insulating layer 270 is performed for forming contact opening 280. Therefore, after filling conductive material into the contact opening 280 in subsequent procedures, the short occurring between the gate and conductive material in the contact opening is avoided. Furthermore, since the buffer layer is embedded in the space, the thickness of the buffer layer is sufficient to protect the gate structure from the stress of the space during the subsequent thermal treatment.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A self-aligned contact process for formation of a contact opening on a semiconductor substrate, comprising the steps of:

providing at least two gate structures on a semiconductor substrate, wherein each gate structure comprises a gate and a passivation layer on the top surface thereof;

conformally overlaying a buffer layer on the gate structure and the semiconductor substrate;

forming a photoresist material on the semiconductor substrate at a level lower than the top surface of the passivation layer;

removing the buffer layer to the level of the photoresist layer;

removing the photoresist material;

forming a spacer on the sidewall of the buffer layer and the passivation layer of the gate structure;

forming an insulating layer on the semiconductor substrate; and forming a contact opening therein to expose the semiconductor substrate.

2. The process as claimed in claim 1, wherein the step of forming a photoresist material on the semiconductor substrate to a level lower than a top surface of the passivation layer comprises:

forming photoresist material on the surface of the semiconductor substrate; and etching back the layer of photoresist material to a level lower than the top surface of the passivation layer.

3. The process as claimed in claim 2, wherein the level of the etched photoresist layer is lower than the top surface of the passivation layer but higher than the interface between the passivation layer and gate.

4. The process as claimed in claim 1, wherein the thickness of the buffer layer is at least about 200Å.

5. The process as claimed in claim 4, wherein the thickness of the buffer layer is at least about 200–300Å.

6. The process as claimed in claim 1, wherein the buffer layer is removed to the level of the photoresist layer by wet etching.

7. The process as claimed in claim 1, wherein the etched photoresist layer is removed by oxygen plasma treatment.

8. The process as claimed in claim 1, wherein the material of the passivation layer is silicon nitride.

9. A self-aligned contact process for formation of a contact opening on semiconductor substrate, comprising the steps of:

providing at least two gate structure on a semiconductor substrate, wherein the gate stricture comprises a gate and a passivation layer on the top surface thereof;

forming a buffer layer covering the sidewall of the gate;

forming photoresist material on topological surface of the semiconductor substrate;

etching back the layer of photoresist material to a level lower than the top surface of the passivation layer;

removing the buffer layer to the level of the layer of photoresist material;

removing the etched photoresist layer;

forming a spacer on the sidewall of the buffer layer and the passivation layer of the gate structure;

forming an insulating layer on the semiconductor substrate; and forming a contact opening therein to expose the semiconductor substrate.

10. The process as claimed in claim 9, wherein the level of the etched photoresist layer is lower than the top surface between the passivation but higher than the interface between the passivation layer and gate.

11. The process as claimed in claim 9, wherein the thickness of the buffer layer is at least about 200Å.

12. The process as claimed in claim 11, wherein the thickness of the buffer layer is at least about 200–300Å.

13. The process as claimed in claim 9, wherein the buffer layer is removed to the level of the photoresist layer by wet etching.

14. The process as claimed in claim 9, wherein the etched photoresist layer is removed by oxygen plasma treatment.

15. The process as claimed in claim 9, wherein the material of the passivation layer is silicon nitride.

* * * * *